(12) United States Patent
Simon

(10) Patent No.: US 7,409,008 B2
(45) Date of Patent: Aug. 5, 2008

(54) TRANSMITTING ARRANGEMENT FOR MOBILE RADIO

(75) Inventor: Martin Simon, Otterfing (DE)

(73) Assignee: Infineon Technologies AG, Munich (DE)

( * ) Notice: Subject to any disclaimer, the term of this patent is extended or adjusted under 35 U.S.C. 154(b) by 689 days.

(21) Appl. No.: 10/797,468

(22) Filed: Mar. 10, 2004

(65) Prior Publication Data

US 2004/0228421 A1 Nov. 18, 2004

Related U.S. Application Data

(63) Continuation of application No. PCT/DE02/03399, filed on Sep. 12, 2002.

(30) Foreign Application Priority Data

Sep. 12, 2001 (DE) ................................ 101 44 907

(51) Int. Cl.
*H04K 1/02* (2006.01)
(52) U.S. Cl. .................................................... 375/296
(58) Field of Classification Search ................. 375/296, 375/285
See application file for complete search history.

(56) References Cited

U.S. PATENT DOCUMENTS

| | | | |
|---|---|---|---|
| 4,545,244 A | 10/1985 | Yasuda et al. | |
| 4,712,056 A | 12/1987 | Schott | |
| 4,816,783 A | 3/1989 | Leitch | |
| 4,878,726 A | 11/1989 | Fatehi | |
| 5,066,924 A | 11/1991 | Wendt | |
| 5,193,223 A * | 3/1993 | Walczak et al. ........... | 455/115.1 |
| 5,479,447 A | 12/1995 | Chow et al. | |
| 5,559,468 A | 9/1996 | Gailus et al. | |
| 5,661,442 A | 8/1997 | Sparks | |
| 5,663,734 A | 9/1997 | Krasner ....................... | 342/357 |
| 5,699,383 A | 12/1997 | Ichiyoshi | |
| 5,847,623 A | 12/1998 | Hadjichristos | |
| 5,949,796 A | 9/1999 | Kumar | |
| 5,965,961 A | 10/1999 | Lampe | |
| 6,016,422 A | 1/2000 | Bartusiak | |
| 6,041,076 A * | 3/2000 | Franchville et al. ......... | 375/224 |
| 6,178,317 B1 | 1/2001 | Kroeger et al. | |

(Continued)

FOREIGN PATENT DOCUMENTS

EP 0 588 444 A1 3/1994

(Continued)

OTHER PUBLICATIONS

Faulkner, M., et al, "Automatic Adjustment of Quadrature Modulators"; Electronic Letters; Jan. 31, 1991, vol. 27, No. 3, pp. 214-216.

*Primary Examiner*—Kevin Y Kim
(74) *Attorney, Agent, or Firm*—Eschweiler & Associates, LLC

(57) ABSTRACT

A transmitting arrangement, in particular for mobile radio, has a quadrature modulator with an upstream, digital signal processing unit. In order to suppress side bands and the carrier frequency, which may occur as a result of excessive matching tolerances between the components which are used, a feedback path couples the modulator output to the digital signal processing unit. The feedback path provides the envelope of the transmission signal at the input of the digital signal processing unit in order to provide preemphasis in the digital signal processing. The envelope can be provided by an undersampling A/D converter in the feedback path.

22 Claims, 2 Drawing Sheets

U.S. PATENT DOCUMENTS

| | | |
|---|---|---|
| 6,259,317 B1 | 7/2001 | Melanson |
| 6,359,936 B1 * | 3/2002 | Shyue ........................ 375/295 |
| 6,369,753 B1 | 4/2002 | Schucker et al. ............. 342/357 |
| 6,542,821 B2 | 4/2003 | Krasner ....................... 701/213 |
| 6,587,513 B1 * | 7/2003 | Ichihara ...................... 375/296 |
| 6,590,944 B1 | 7/2003 | Kroeger |
| 6,668,024 B1 | 12/2003 | Andre |
| 6,680,984 B1 | 1/2004 | Teghararian et al. |
| 6,720,839 B1 * | 4/2004 | Torre et al. .................. 332/103 |
| 6,735,257 B2 | 5/2004 | Kroeger |
| 2003/0165200 A1 * | 9/2003 | Pugel ........................ 375/316 |
| 2004/0105505 A1 | 6/2004 | Kitamura |

FOREIGN PATENT DOCUMENTS

| | | |
|---|---|---|
| EP | 1 039 628 A1 | 9/2000 |
| WO | WO 00/31941 | 6/2000 |
| WO | WO 00/57545 | 9/2000 |

* cited by examiner

TRANSMITTING ARRANGEMENT FOR MOBILE RADIO

This application is a continuation of copending International Application No. PCT/DE02/03399, having an international filing date of Sep. 12, 2002.

FIELD OF THE INVENTION

The present invention relates to a transmitting arrangement, in particular for mobile radio.

BACKGROUND OF THE INVENTION

Modern, broadband mobile radio systems use not only phase modulation but also an amplitude component for modulation in order to achieve a wider bandwidth, in order to make it possible to comply with the relatively stringent requirements for data transmission rates.

Linear modulation methods of this type, such as those envisaged in the GSM EDGE (Global System for Mobile Communication) Standard, place more stringent requirements on the linearity characteristics of transmitting and receiving arrangements in mobile radio and on carrier and side band suppression at the output of a transmitting arrangement, however. These are in turn dependent on manufacturing tolerances, in particular matching tolerances between the components used in a transmitting arrangement.

Quadrature modulators in transmitting arrangements for mobile radio to which, for example, a complex baseband signal can be supplied, which is modulated onto a carrier frequency, require a local oscillator signal which likewise comprises two components shifted through 90° with respect to one another. Discrepancies from signal orthogonality, that is to say from the phase shift of 90° for the carrier signal, lead, for example owing to excessively large matching tolerances between the components in an upstream frequency divider, to inadequate side band suppression in the frequency mixer and/or in the IQ modulator.

Furthermore, offset voltages in the baseband signal (which may arise, for example, because of mismatches between the components that are used) cause inadequate carrier suppression in the mobile radio transmitter. The carrier suppression may also be made worse as a result of inadequate isolation between the local oscillator signal input and the signal output of the modulator, causing crosstalk from the carrier signal to the modulator output. However, inadequate carrier and side band suppression results in a phase error in the digitally modulated output signal of the transmitting arrangement.

The document by M. Faulkner, T. Mattsson, and W. Yates entitled "Automatic Adjustment of Quadrature Modulators", Electronics Letters, Jan. $31^{st}$, 1991, Vol. 27 No. 3, pp. 214-216, describes a quadrature modulator with a feedback path which acts on a correction network at the input of the modulator in order to compensate for phase errors as well as offset errors in the transmitting arrangement by appropriate preemphasis of the baseband signal. In this case, however, a directional coupler for outputting the radio-frequency transmission signal, an additional amplifier as well as a downstream power detector are required in the feedback path which is connected to the output of the modulator, and these result in a relatively large chip area requirement, additional, undesirable power consumption, and increased manufacturing costs.

An object of the present invention is to specify a transmitting arrangement, in particular for mobile radio, which can be produced with little complexity and is suitable for mass production, while maintaining the carrier and side band suppression that are required for linear modulation methods.

SUMMARY OF THE INVENTION

According to exemplary embodiments of the invention, a transmitting arrangement for mobile radio, includes: a quadrature modulator having an in-phase and quadrature input for supplying a complex-value payload signal, having a local oscillator signal input for supplying a complex-value signal at a carrier frequency, and having a signal output at which a modulated transmission signal is produced; a digital signal processing unit, which is coupled to the in-phase and quadrature input for supplying the complex-value payload signal; and a feedback path, which couples the modulator output to the digital signal processing unit by means of an analog/digital converter, at whose output the envelope of the modulated transmission signal is produced.

In exemplary embodiments of a transmitting arrangement according to the invention, a feedback path is provided between the output of the quadrature modulator and a digital signal processing unit which is coupled to the input of the quadrature modulator, for example via D/A (digital/analog) converters. An analog/digital converter is provided in the feedback path in order to obtain the envelope of the modulated transmission signal.

A preemphasis network is provided in the digital signal processing unit, which sets the phase angle of the in-phase and quadrature components of the complex-value payload signal with respect to one another and/or the amplitude of the in-phase or quadrature component, for example by addition of a digital offset to one of the two signal components. While the former ensures side band suppression, the latter provides carrier suppression, in each case also in the event of any mismatches between the components in the transmitter.

Exemplary embodiments allow good carrier and side band suppression, thus allowing the arrangement to be operated using linear modulation methods such as GSM EDGE, with a particularly simple design and without any additional complexity, because an analog/digital converter has to be provided in the feedback path in any case.

The A/D converter in the feedback path is preferably designed for undersampling of the modulated transmission signal. Undersampling in this case means that the sample frequency of the A/D converter is lower than the carrier frequency of the modulated, radio-frequency transmission signal but, in accordance with the sampling theorem, is sufficiently high to allow recovery of the envelope of the modulated transmission signal, that is to say of the modulation signal itself or of a signal which is derived from it.

According to one alternative transmitting arrangement according to the invention, a step-down frequency converter, which couples the modulator output to the digital signal processing unit, is provided in the feedback path. The step-down converter (or mixer) converts the modulator output signal from radio frequency to a low frequency, for example to baseband. A signal which has been down-mixed in this way and is derived from the modulated transmission signal may, for example, be supplied to the digital signal processing unit via a low-pass filter and an A/D converter for preemphasis of the in-phase and quadrature components of the payload signal. The step-down mixer replaces a directional coupler with a downstream power detector, and makes it possible to produce a transmitting arrangement with a particularly simple design, which is suitable for mass production.

The aforementioned alternative solutions presented according to the present invention have the common feature that the described matching by means of preemphasis makes it possible to compensate not only for manufacturing-dependent mismatches and component tolerances but also for temperature drifts as well as aging phenomena in the components. With regard to the configuration of the feedback path with a directional coupler, amplifier and power detector, the present embodiments also offer a wider dynamic range in addition to less complexity.

The step-down frequency converter is preferably driven by a local oscillator signal at the same frequency at which the quadrature modulator is also driven. The down-mixed, fedback signal which is derived from the modulated transmission signal is accordingly at the same frequency, for example in baseband, as the payload signal (to be transmitted) at the input of the quadrature modulator.

For this purpose, the local oscillator inputs can be connected from quadrature modulators and frequency step-down mixers via frequency dividers, preferably with the same division ratio, to a common oscillator, for example a voltage controlled oscillator.

In a further preferred embodiment of the present invention, the quadrature modulator has two Gilbert multipliers, which are coupled to one another on the output side via an adder.

A quadrature modulator which has two Gilbert multipliers normally requires a tight matching tolerance between the mixer cells that are used. However, mismatches in the present arrangement can be compensated for in advance in a simple manner by the preemphasis or matching device which is made possible by the present arrangement, so that good carrier and side band suppression are nevertheless ensured despite lowcost mass production.

In a further preferred embodiment of the present invention, a bandpass filter is connected between the feedback path and the output of the quadrature modulator.

A power amplifier, with an upstream bandpass filter for band limiting of the transmission signal, is normally provided at the output of a modulator for coupling to a transmitting antenna in a transmitting arrangement, in particular for mobile radio. The tap for the feedback path may preferably be connected between the bandpass filter output and the power amplifier input.

In a further preferred embodiment of the present invention, a low-pass filter is provided in the feedback path and is connected upstream of the analog/digital converter.

In a further preferred embodiment of the present invention, in each case a digital/analog converter with a downstream low-pass filter is provided both in an in-phase branch and in a quadrature branch in order to carry the complex-value payload signal, in order to couple the digital signal processing unit and the quadrature modulator.

In a further preferred embodiment of the present invention, the digital signal processing unit has a memory for storing preemphasis information, which is determined in an adjustment mode as a function of the envelope.

The adjustment mode may be characterized, for example, by transmission of a test signal, for example a harmonic sinusoidal signal, and by matching in the digital signal processing unit by preemphasis of the baseband payload signal on the one hand by addition of an offset to the in-phase or quadrature component, and on the other hand by influencing the phase shift between the I and Q signals. Correction values recorded in this way on the one hand for carrier suppression and on the other hand for side band suppression, which are determined in this test signal mode, can then be stored in a memory in the digital signal processing unit, and may be used for transmitter matching during the normal transmission mode.

In various embodiments, the described matching can be carried out once only by preemphasis, for example during production, and/or can be carried out either in a test mode, for example when switching on the transmitter with the proposed transmitting arrangement, or else during normal operation. This makes it possible to compensate not only for manufacturing-dependent drift and matching tolerance effects, but also for temperature-dependent and aging-dependent drift and matching tolerance effects.

BRIEF DESCRIPTION OF THE DRAWINGS

The invention will be explained in more detail in the following text using a number of exemplary embodiments and with reference to the drawings, in which.

DETAILED DESCRIPTION

Figure 1:
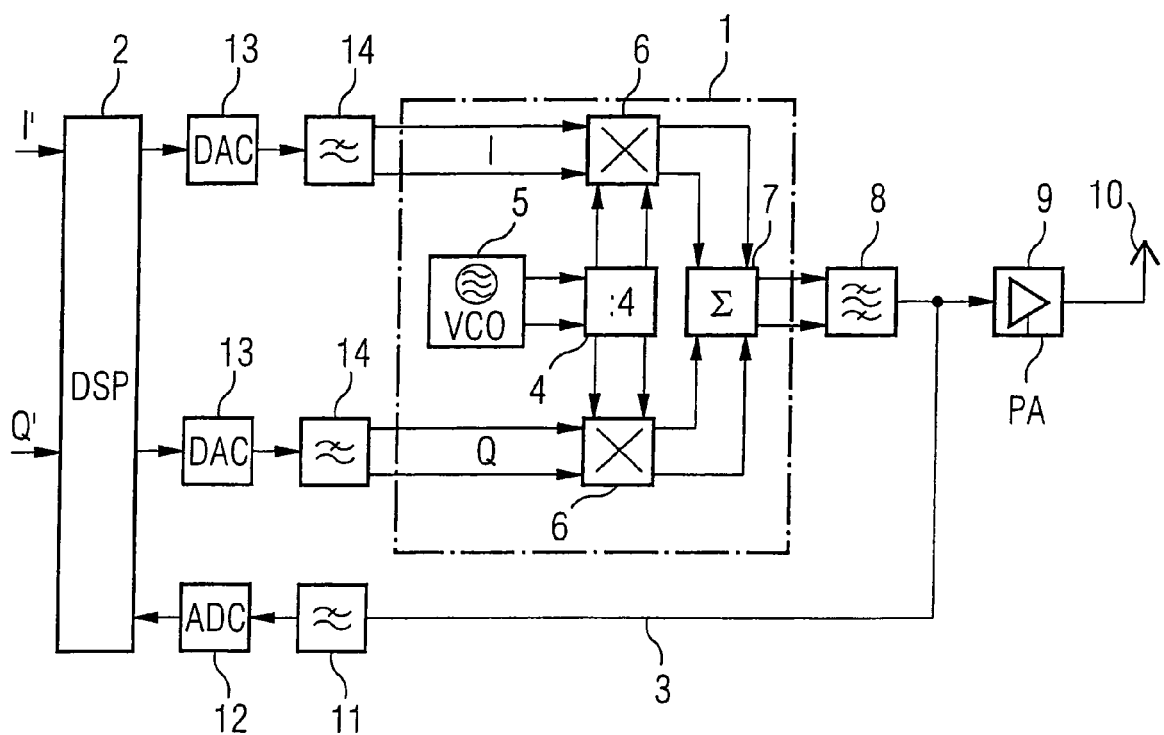
FIG. 1 uses a simplified block diagram to show exemplary embodiments of the present invention, FIG. 2 uses a simplified block diagram to show further exemplary embodiments of the present invention.

Reference symbols in the drawings include:
1 Quadrature modulator
2 Digital signal processing
3 Feedback path
4 Frequency divider
5 Voltage controlled oscillator
6 Analog mixer
7 Adder
8 Bandpass filter
9 Power amplifier
10 Antenna
11 Low-pass filter
12 A/D converter
13 D/A converter
14 Low-pass filter
15 Step-down mixer
16 Frequency divider
17 Amplitude correction
18 Amplitude correction
19 Phase correction
I In-phase component
Q Quadrature component FIG. 1 shows a quadrature modulator 1 with an in-phase and quadrature input for supplying a complex-value payload signal comprising an in-phase component I and a quadrature component Q. The quadrature modulator 1 also has a local oscillator input, which is connected to a voltage controlled oscillator 5 via a divide-by-four frequency divider 4 in order to supply a complex-value signal at a carrier frequency. The quadrature modulator has two analog multipliers 6 of the Gilbert type, one of which is coupled to the in-phase input, and another of which is coupled to the quadrature input of the quadrature modulator, and each of the two analog multipliers 6 is connected by its local oscillator input via the frequency divider 4 to the voltage controlled oscillator 5. The inputs and outputs of the multipliers 6 for the quadrature modulator 1 are in this case each designed to carry balanced signals. The outputs of the two analog multipliers 6 are each connected to one input of an adder 7, whose output forms the signal output of the quadrature modulator 1, which is likewise designed to be balanced in order to carry differential signals. The output of the adder 7 is also connected by means of balanced circuitry to a bandpass filter 8 for band limiting of the radio-frequency transmission signal, and this is followed by a power amplifier 9 (PA). The output side of the power amplifier 9 is coupled to a transmitting antenna 10. The output of the bandpass filter 8 is also connected to a feedback loop 3, which has a low-pass filter 11 with a downstream analog/digital converter 12, and which couples the output of the quadrature modulator 1 to the digital signal processing unit 2, to which the output of the A/D converter 12 is connected. The input of the low-pass filter 11 is connected to the output of the bandpass filter 8.

The digital signal processing unit 2 produces a complex-value baseband signal on the output side, which provides the payload data to be transmitted as a modulation signal, broken down into an in-phase component I and a quadrature component Q. This baseband signal, broken down into an in-phase branch and a quadrature branch separately from one another, is in each case supplied via a digital/analog converter 13 with a downstream low-pass filter 14 to the payload signal inputs of the quadrature modulator 1.

In the normal transmission mode, the carrier and side band suppression of the modulator 1 may be inadequate, or may produce an excessive phase error in the digitally modulated transmission signal, for example because of excessive matching tolerances (mismatches) between the components in the frequency divider for the quadrature modulator 1. According to the present subject matter, this is countered by the feedback branch 3 providing preemphasis, which is derived from the transmission signal fed back in this way, in the digital signal processing unit 2 with regard to the phase angles and amplitudes of the signal components of the baseband signal.

To this end, the A/D converter 12 is designed such that the envelope of the transmission signal is produced at its output, that is to say the sampling rate of the A/D converter is lower than the carrier frequency of the transmission signal, but is designed so as to ensure reliable detection of the modulation signal, on the basis of the sampling theorem, that is to say detection of the envelope of the transmission signal. The modulator may be matched in order to improve the carrier suppression, such that, in the digital signal processing unit 2, the amplitude of the in-phase component I or of the quadrature component Q of the baseband payload signal is changed in the digital signal processing unit 2, for example by addition of a DC voltage offset to one of the signal components. The present arrangement alternatively or additionally makes it possible to reduce the side band suppression, likewise by preemphasis in the digital signal processing unit. This influences the phase shift between the in-phase component and the quadrature component in an appropriate manner during matching of the mobile radio transmitter, thus suppressing the side band.

Automatic matching of the transmitting arrangement as shown in FIG. 1 may, for example, be carried out in a test operating mode. In this case, an unmodulated sinusoidal test signal is output via the D/A converters 13 and is up-mixed by the modulator 1 to the transmission frequency. The transmitted test signal is sampled by means of the A/D converter 12, and the amplitudes of the carrier and of the side band are determined. The analog offset voltages of the modulator can be regulated out by addition of a digital offset to the amplitude of the in-phase signal or of the quadrature signal, thus providing carrier frequency suppression. Any phase mismatch between the carrier signals, which are likewise shifted through 90°, can be regulated out by influencing the phase shift between the I and Q components of the payload signal, thus providing side band suppression. The values which are determined in the test mode are then stored in the digital signal processing unit 2, in order to be available for the normal transmission mode with modulated baseband signals.

The present transmitting arrangement allows sufficiently good carrier and side band suppression even in the event of the matching tolerances and mismatches which normally occur with mass production methods. The present arrangement accordingly allows operation using linear modulation methods, such as those envisaged in the GSM EDGE mobile radio standard, making better use of the bandwidth that is available in mobile radio channels and thus being suitable for bandwidth-intensive mobile radio applications, such as video transmission, Internet, etc. Since the requirements for the matching tolerances between the components that are used are less stringent, the present transmitting arrangement with the described matching circuit can make use of smaller transistors and resistors, for example based on 120 nm CMOS (Complementary Metal Oxide Semiconductor) technology, thus saving chip area, because the offset voltages which can be regulated out here depend on the mismatch between the components, and thus on the magnitude thereof. The high degree of carrier suppression which is required for GSM EDGE can be achieved, as described, by modulator matching.

Figure 2:
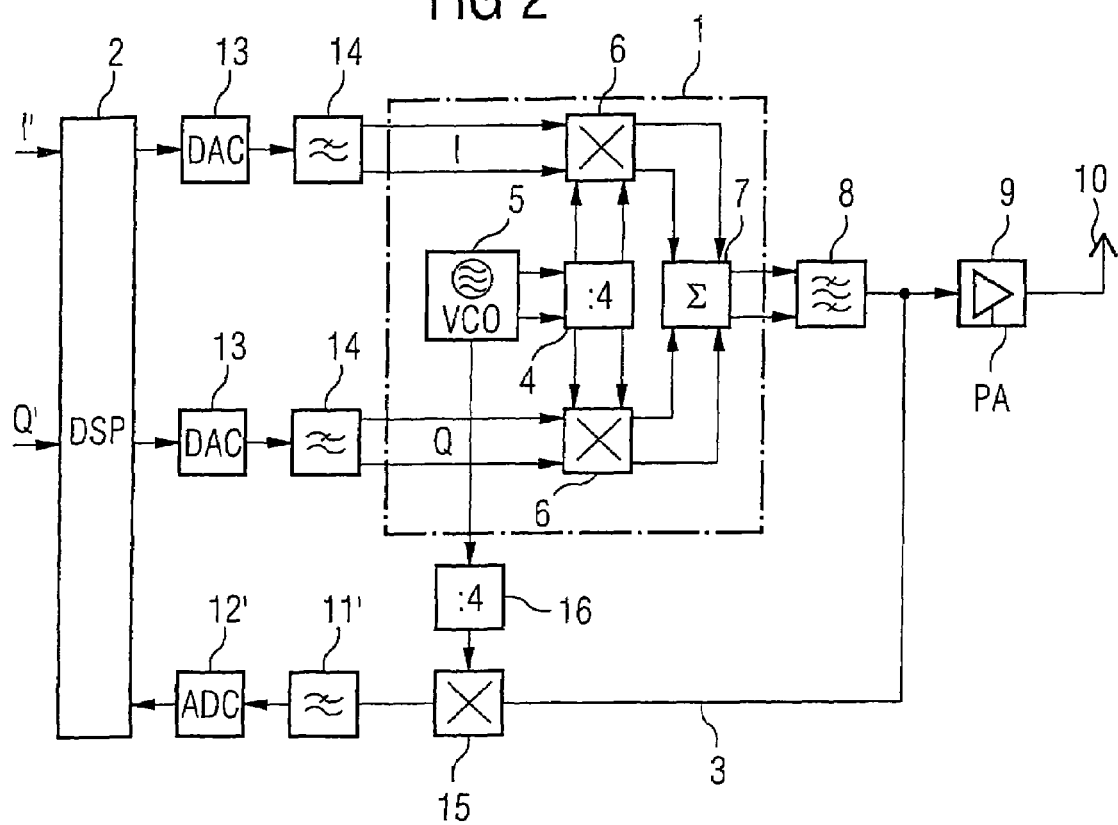

FIG. 2 shows alternative embodiments of a mobile radio transmitter according to the invention. The design and operation of this mobile radio transmitter largely correspond to those of the transmitter shown in FIG. 1, but differ in the design of the feedback path 3.

Instead of the undersampling that is provided in the A/D converter 12 as shown in FIG. 1 in order to obtain the envelope of the transmission signal, an additional step-down mixer 15 is provided in the feedback path 3 in the transmitting arrangement shown in FIG. 2, and its first signal input is connected to the output of the bandpass filter 8. The output of the step-down mixer 15 is connected to a low-pass filter 11' with a downstream A/D converter 12', and these are matched to the frequency, which is now lower. The step-down mixer 15 is connected by a second input, the local oscillator input, via a frequency divider 16 (whose division ratio is the same as that of the frequency divider 4 of the quadrature modulator 1) to the voltage controlled oscillator 5 for the quadrature modulator 1. This results in the envelope of the transmission signal being produced in baseband at the output of the frequency mixer 15.

In alternative embodiments, the step-down mixer 15 could also be driven by an additional oscillator.

In alternative embodiments, the frequency divider 16 could have a different division ratio to that of the frequency divider 4.

A combination of the feedback paths illustrated in FIGS. 1 and 2 would also be within the scope of the present invention, for example by the step-down mixer 15 providing downmixing to an intermediate frequency rather than to baseband, and by the A/D converter 12' carrying out appropriate undersampling.

Figure 3:
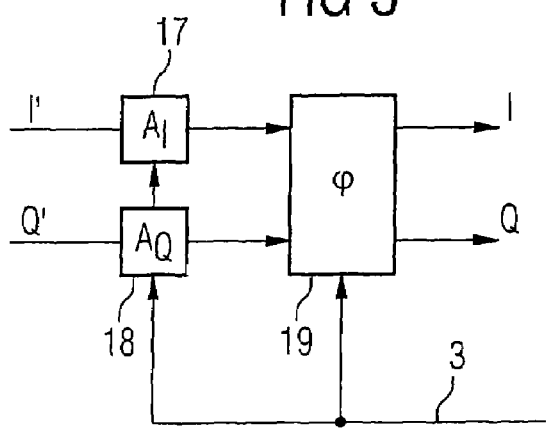
FIG. 3 shows an example of an arrangement of a preemphasis network for a transmitting arrangement as shown in FIG. 1 or FIG. 2.

Finally, FIG. 3 shows an exemplary embodiment of a preemphasis circuit such as that which can be implemented in the digital signal processing units 2 shown in FIGS. 1 and 2. In this case, the feedback path 3 is coupled on the one hand to amplitude correction elements 17, 18, and on the other hand to a downstream phase correction network 19, in each case at a control input. By way of example, the desired carrier suppression can be achieved by preemphasis such as this, by addition of an offset value to the in-phase component or quadrature component of a digital modulation signal in baseband I', Q' by means of the corresponding amplitude correction module 17, 18. The downstream phase correction network 19, which is connected to the outputs of the amplitude correction networks 17, 18, influences the phase difference between the in-phase component and quadrature component of the complex-value payload signal in baseband in order to improve the side band suppression in the quadrature modulator 1. The in-phase and quadrature components I, Q which are produced at the output of the digital signal processing unit 2 are produced in a preemphasized form on the output side of the phase correction network 19, such that a transmission signal with good carrier and side band suppression is produced at the output of the transmitting arrangement as shown in FIG. 1 or 2.

Although exemplary embodiments of the invention are described above in detail, this does not limit the scope of the invention, which can be practiced in a variety of embodiments.

What is claimed is:

1. A signal transmission apparatus, comprising:
   a quadrature modulator having an in-phase and quadrature input for receiving a complex-value payload signal, having a local oscillator signal input for receiving a local oscillator signal at a carrier frequency, and having a signal output for providing a modulated transmission signal,
   a digital signal processing unit coupled to the in-phase and quadrature input for receiving the complex-value payload signal; and
      wherein the digital signal processing unit comprises a preemphasis network;
         wherein the preemphasis in the preemphasis network is adapted to effect the relative phase of the in-phase and quadrature component of the complex-value payload signal relative to each other and/or an amplitude of the in-phase and quadrature input, and wherein the preemphasis is configured to effectuate sideband suppression and carrier suppression, respectively;
   a feedback path which couples the signal output to the digital signal processing unit, the feedback path including an analog/digital converter for undersampling the modulated transmission signal with respect to the carrier frequency to produce an envelope of the modulated transmission signal, wherein the preemphasis network setting is a function of the envelope of the modulated transmission signal.

2. The apparatus of claim 1, wherein the quadrature modulator includes first and second Gilbert multipliers which respectively receive in-phase and quadrature components of the complex-value payload signal, and the quadrature modulator including an adder, the first and second Gilbert multipliers having respective outputs which are coupled to the adder.

3. The apparatus of claim 1, including a bandpass filter connected between the signal output and the feedback path.

4. The apparatus of claim 3, wherein the feedback path includes a low-pass filter connected upstream of the analog/digital converter.

5. The apparatus of claim 1, wherein the feedback path includes a low-pass filter connected upstream of the analog/digital converter.

6. The apparatus of claim 1, including first and second digital/analog converters coupled between the digital signal processing unit and the in-phase and quadrature input, the first and second digital/analog converters for respectively supplying in-phase and quadrature components of the complex-value payload signal, and first and second low-pass filters respectively coupling the first and second digital/analog converters to the in-phase and quadrature input.

7. The apparatus of claim 6, wherein the quadrature modulator includes first and second Gilbert multipliers which respectively receive the in-phase and quadrature components of the complex-value payload signal, and the quadrature modulator including an adder, the first and second Gilbert multipliers having respective outputs which are coupled to the adder.

8. The apparatus of claim 7, wherein the digital signal processing unit includes means for influencing an amplitude and phase angle of the complex-value payload signal as a function of the envelope of the modulated transmission signal.

9. The apparatus of claim 8, wherein the digital signal processing unit is for storing preemphasis information determined as a function of the envelope of the modulated transmission signal.

10. The apparatus of claim 7, wherein the digital signal processing unit is for storing preemphasis information determined as a function of the envelope of the modulated transmission signal.

11. The apparatus of claim 6, wherein the digital signal processing unit includes means for influencing an amplitude and phase angle of the complex-value payload signal as a function of the envelope of the modulated transmission signal.

12. The apparatus of claim 11, wherein the digital signal processing unit is for storing preemphasis information determined as a function of the envelope of the modulated transmission signal.

13. The apparatus of claim 6, wherein the digital signal processing unit is for storing preemphasis information determined as a function of the envelope of the modulated transmission signal.

14. The apparatus of claim 1, wherein the digital signal processing unit is for storing preemphasis information determined as a function of the envelope of the modulated transmission signal.

15. The apparatus of claim 14, wherein the quadrature modulator includes first and second Gilbert multipliers which respectively receive in-phase and quadrature components of the complex-value payload signal, and the quadrature modulator including an adder, the first and second Gilbert multipliers having respective outputs which are coupled to the adder.

16. The apparatus of claim 14, including a bandpass filter connected between the signal output and the feedback path.

17. The apparatus of claim 14, wherein the feedback path includes a low-pass filter connected upstream of the analog/digital converter.

18. The apparatus of claim 1, wherein the digital signal processing unit includes means for influencing an amplitude and phase angle of the complex-value payload signal as a function of the envelope of the modulated transmission signal.

19. The apparatus of claim 18, wherein the quadrature modulator includes first and second Gilbert multipliers which respectively receive in-phase and quadrature components of the complex-value payload signal, and the quadrature modulator including an adder, the first and second Gilbert multipliers having respective outputs which are coupled to the adder.

20. The apparatus of claim 18, including a bandpass filter connected between the signal output and the feedback path.

21. The apparatus of claim 18, wherein the feedback path includes a low-pass filter connected upstream of the analog/digital converter.

22. The apparatus of claim 1, provided as a mobile radio signal transmission apparatus.

* * * * *